(12) United States Patent
Eib et al.

(10) Patent No.: US 7,189,498 B2
(45) Date of Patent: Mar. 13, 2007

(54) PROCESS AND APPARATUS FOR GENERATING A STRONG PHASE SHIFT OPTICAL PATTERN FOR USE IN AN OPTICAL DIRECT WRITE LITHOGRAPHY PROCESS

(75) Inventors: Nicholas K. Eib, San Jose, CA (US); Ebo H. Croffie, Portland, OR (US); Neal P. Callan, Lake Oswego, OR (US)

(73) Assignee: LSI Logic Corporation, Milpitas, CA (US)

( * ) Notice: Subject to any disclaimer, the term of this patent is extended or adjusted under 35 U.S.C. 154(b) by 148 days.

(21) Appl. No.: 10/993,603

(22) Filed: Nov. 19, 2004

(65) Prior Publication Data
US 2005/0153246 A1    Jul. 14, 2005

Related U.S. Application Data

(60) Provisional application No. 60/535,586, filed on Jan. 8, 2004.

(51) Int. Cl.
*G03C 5/00*    (2006.01)
(52) U.S. Cl. .................. 430/322; 430/311; 430/313; 430/394; 355/67
(58) Field of Classification Search ............... None
See application file for complete search history.

(56) References Cited

U.S. PATENT DOCUMENTS

2005/0068510 A1 *  3/2005  Bleeker et al. ............... 355/67
2006/0068334 A1 *  3/2006  Sandstrom et al. .......... 430/322

OTHER PUBLICATIONS

Yashesh Shroff et al., "Optical Analysis of Mirror Based Pattern Generation", Emerging Lithographic Technologies VII, Proceedings of SPIE vol. 5037 (2003), pp. 550-559.
U.S. Appl. No. 60/513,780, filed Oct. 22, 2003.
U.S. Appl. No. 60/535,586, filed Jan. 1, 2004.
U.S. Appl. No. 10/825,342, filed Apr. 14, 2004.

\* cited by examiner

*Primary Examiner*—John A. McPherson
*Assistant Examiner*—Daborah Chacko-Davis
(74) *Attorney, Agent, or Firm*—Beyer Weaver LLP

(57) ABSTRACT

The present invention provides methods and apparatus for accomplishing a strong phase shift direct write lithography process using reconfigurable optical mirrors. A maskless lithography system is provided. The maskless direct-write lithography system provided uses an array of mirrors configured to operate in a tilting mode, a piston-displacement mode, or both in combination. The controlled mirror array is used to generate strong phase shift optical patterns which are directed onto a photoimageable layer of a substrate in order to facilitate pattern transfer. In order to avoid constraining the system to forming edges of patterns aligned with the array of mirrors, gray-scale techniques are used for subpixel feature placement.

23 Claims, 10 Drawing Sheets

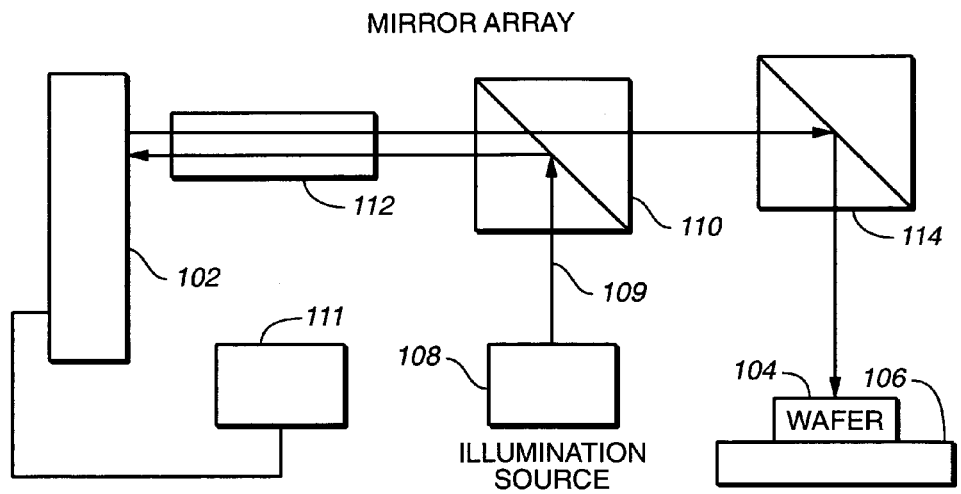
FIG._1A
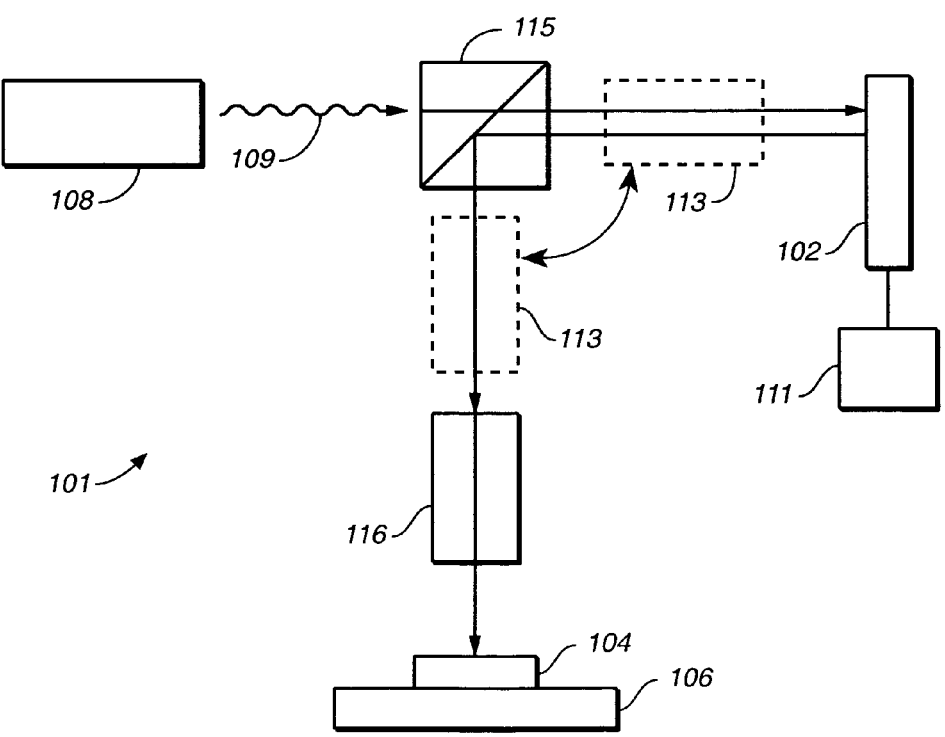
FIG._1B

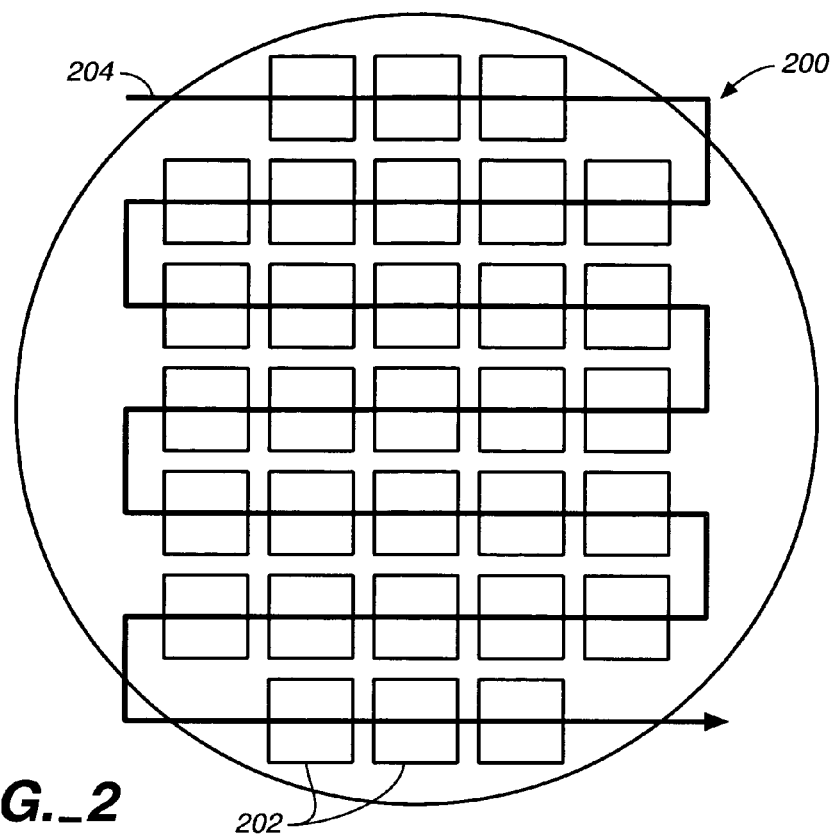
FIG._2
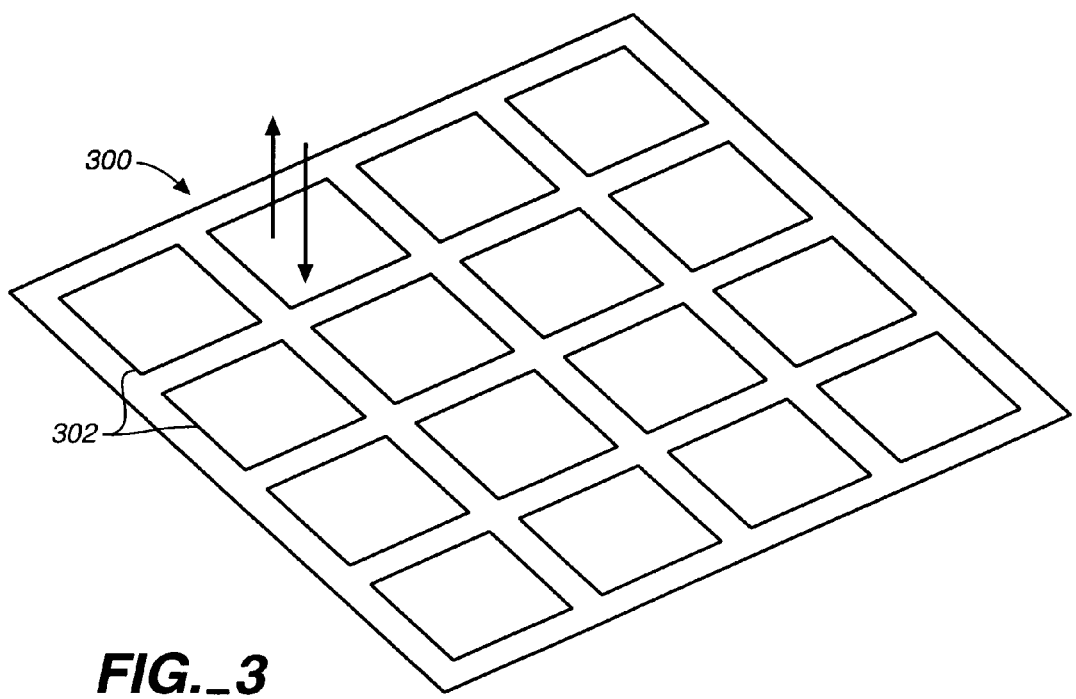
FIG._3

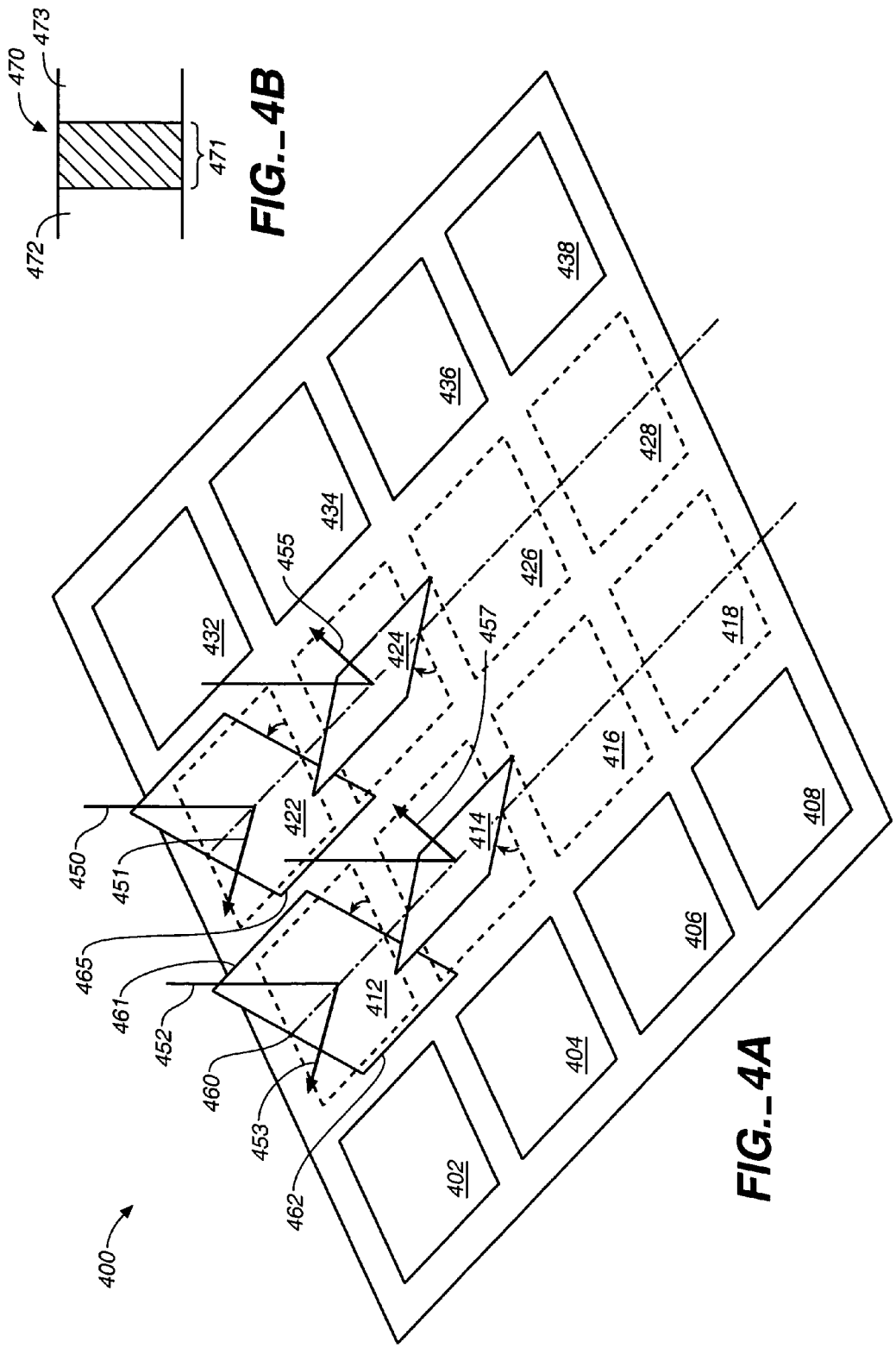

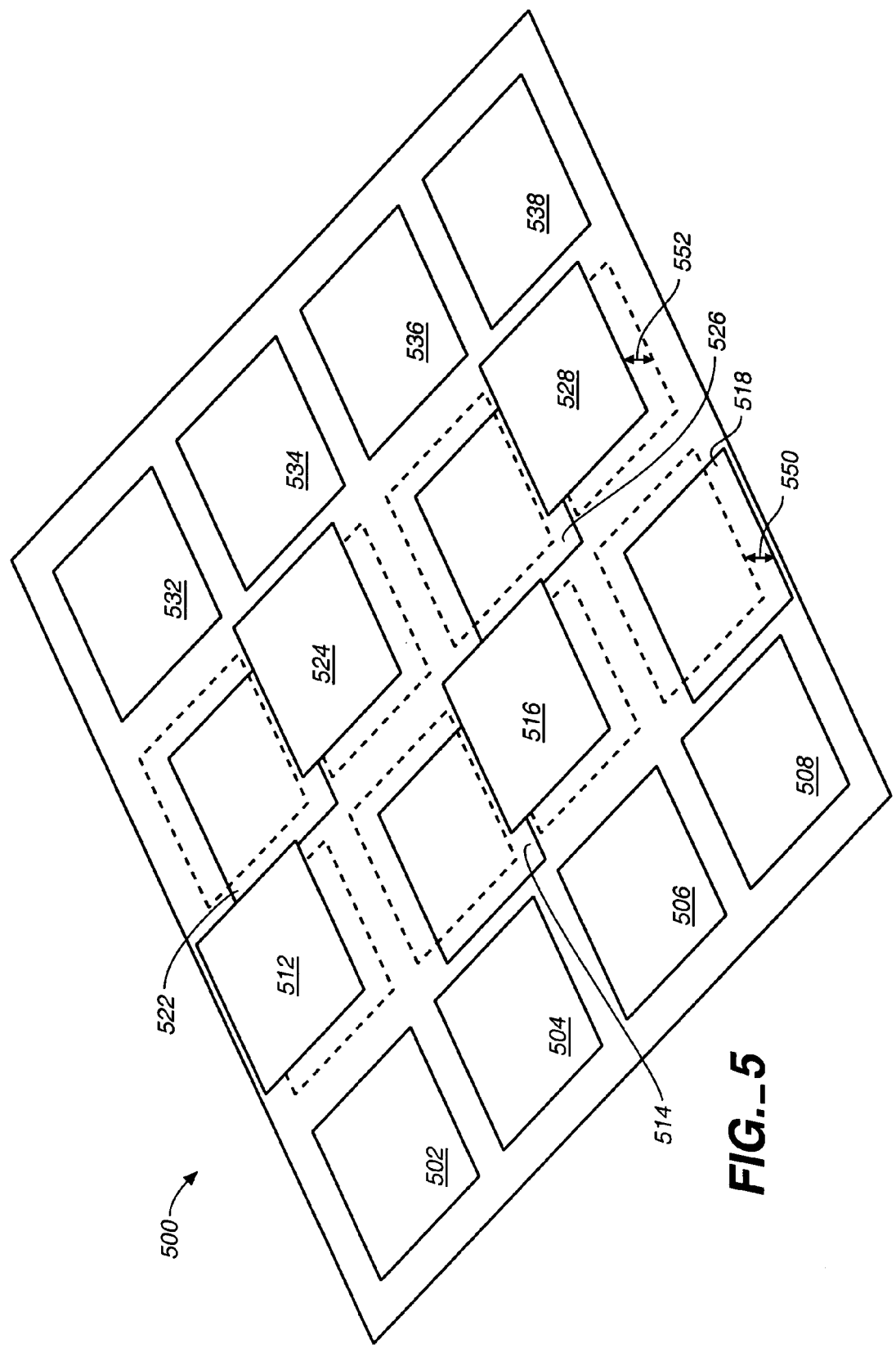
FIG._5

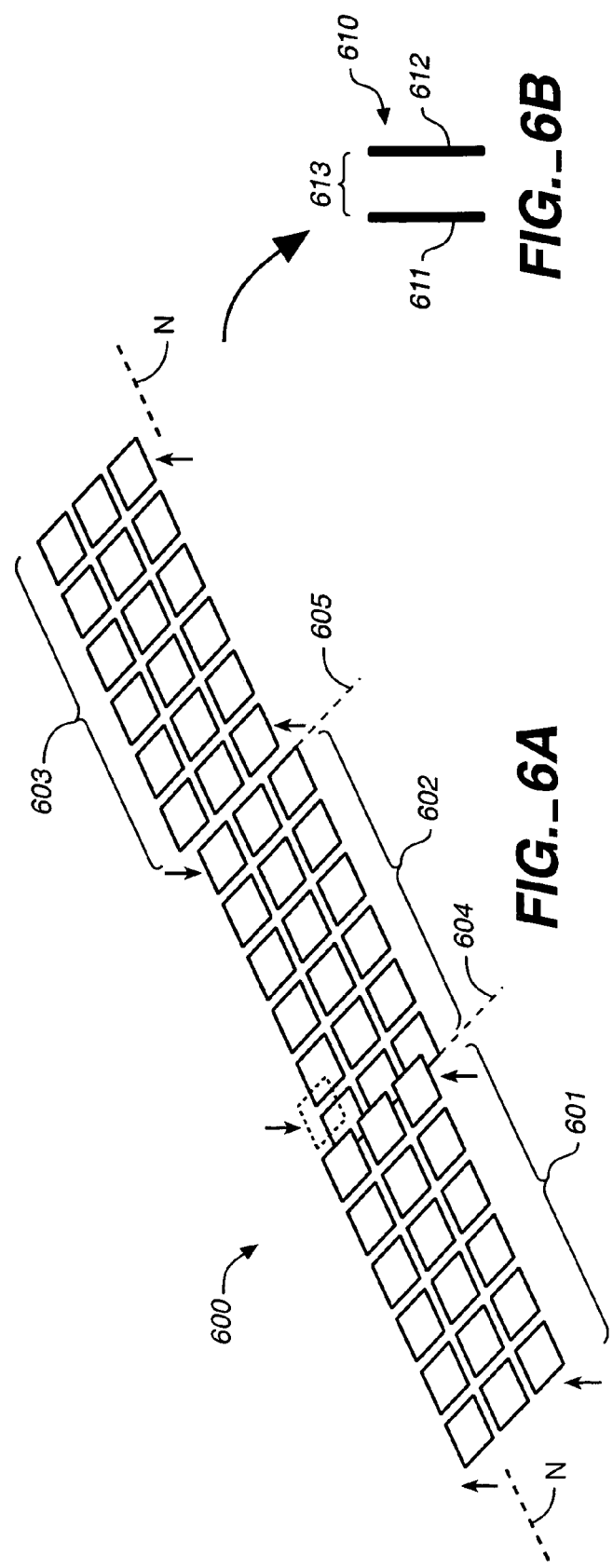
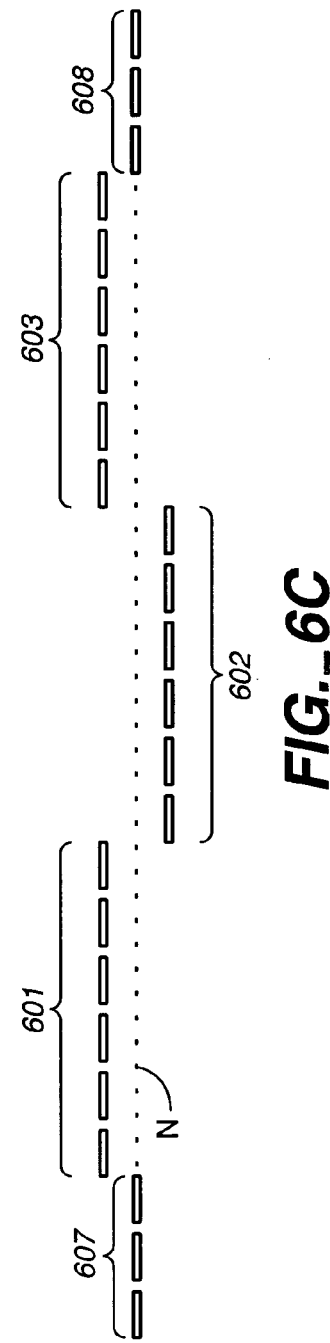
FIG._6A
FIG._6B
FIG._6C

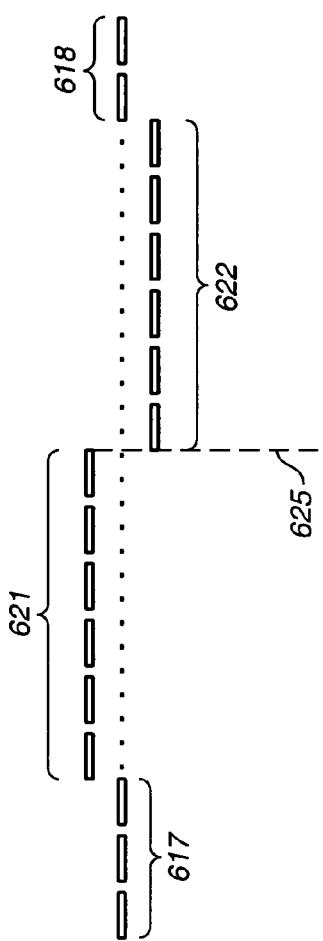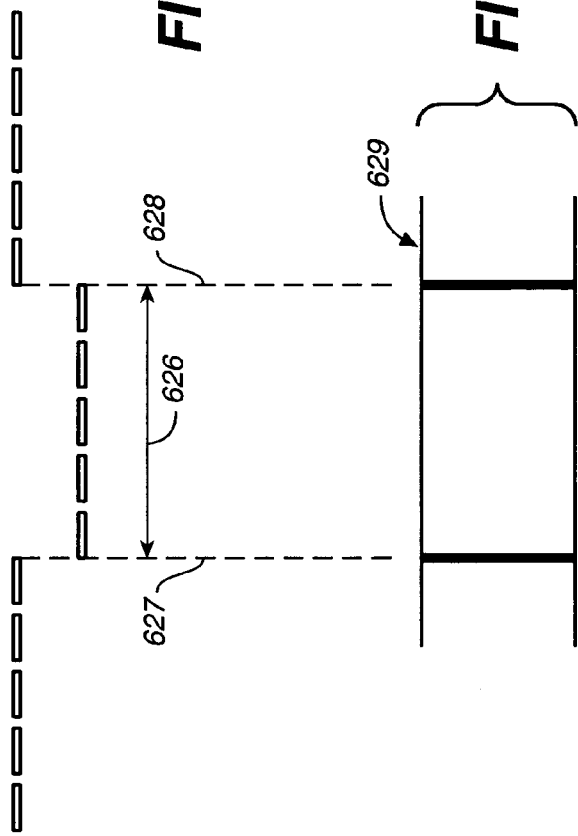

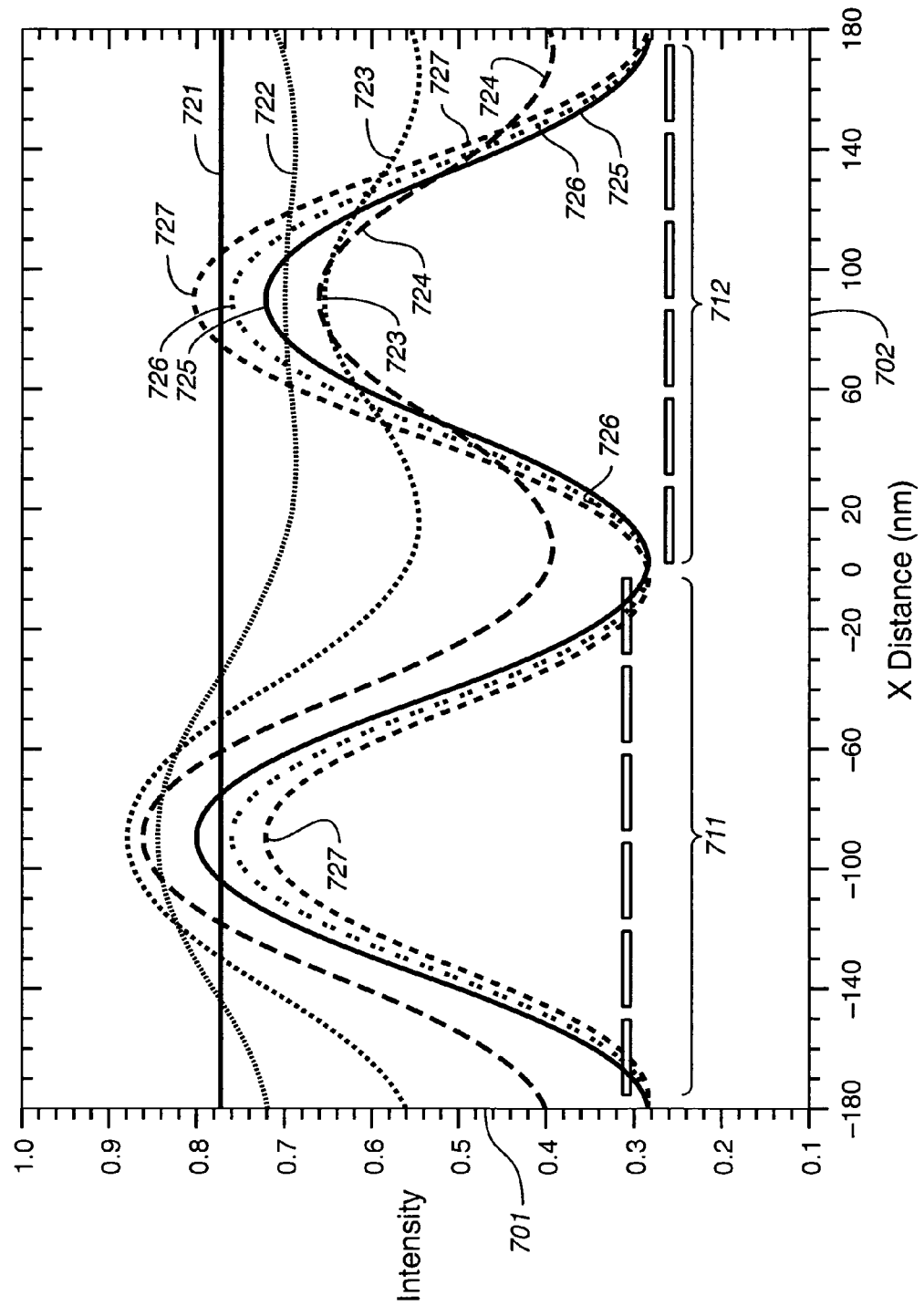
FIG._7

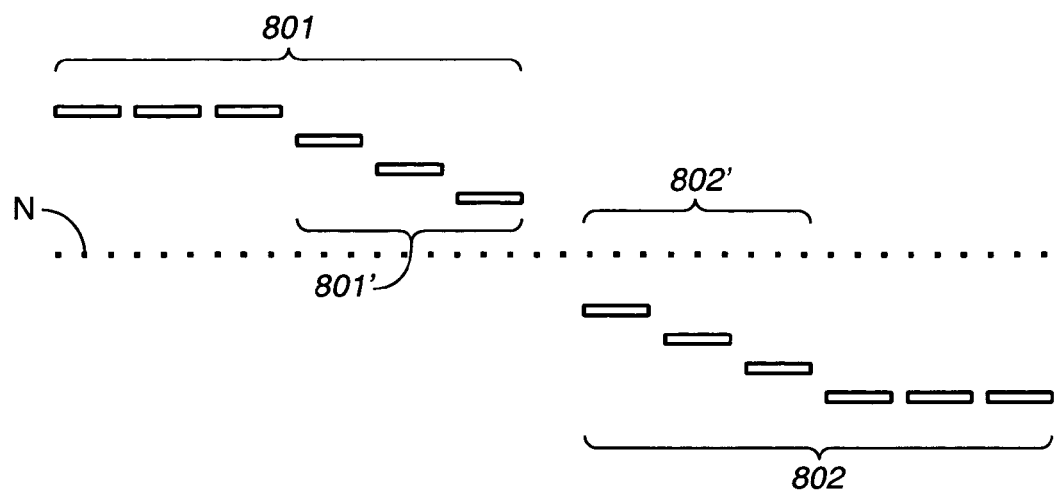
FIG._8
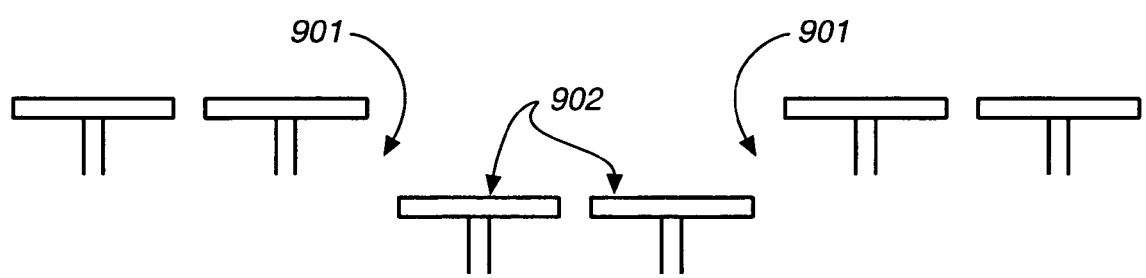
FIG._9

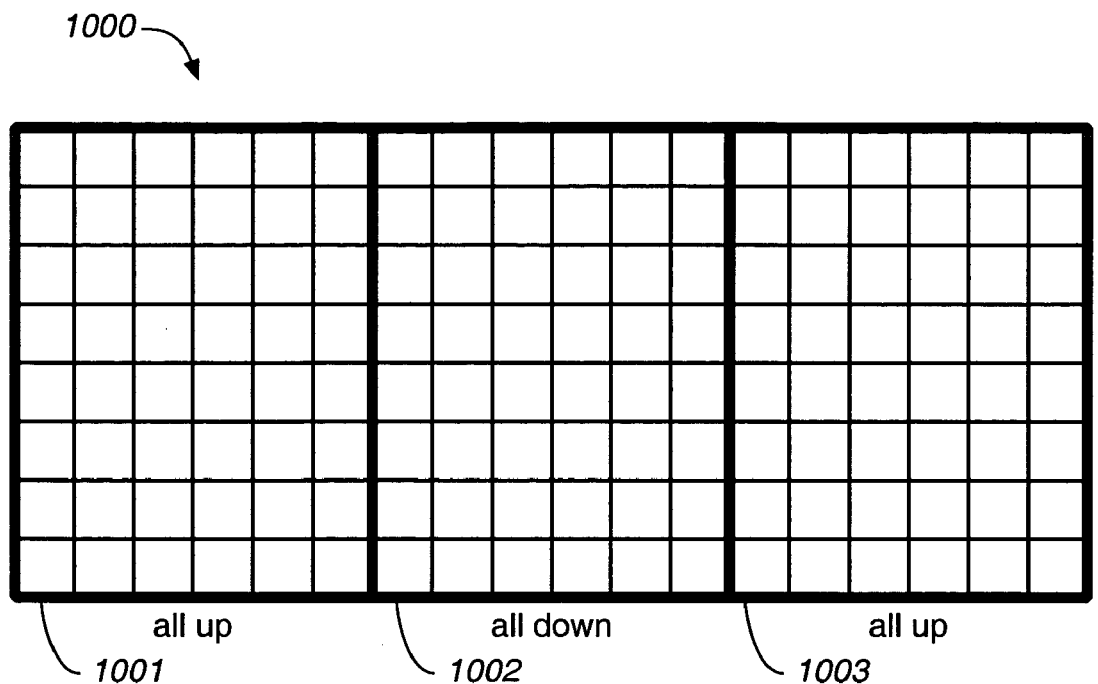
FIG._10A
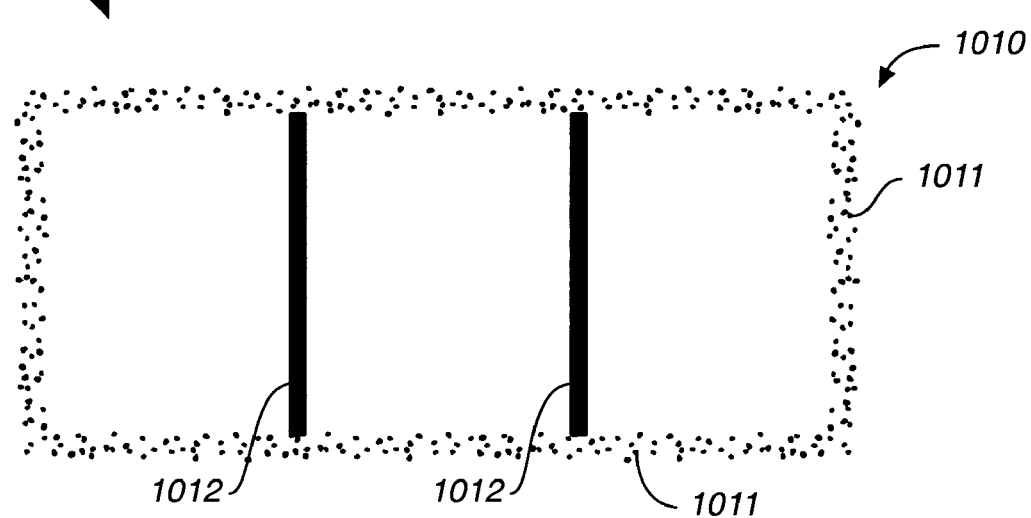
FIG._10B

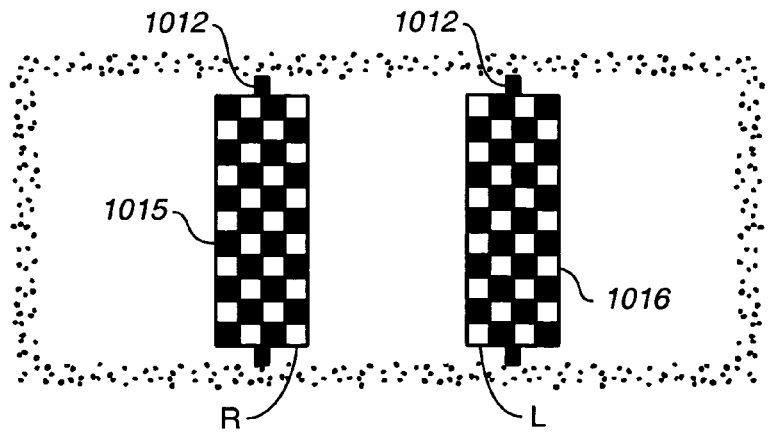
FIG._10C
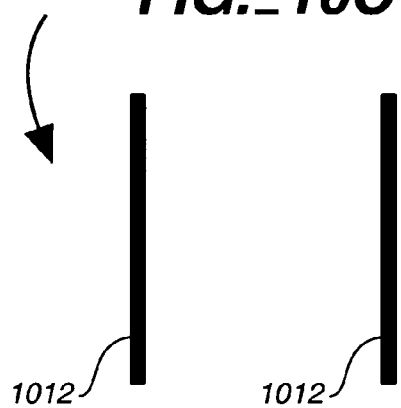
FIG._10D
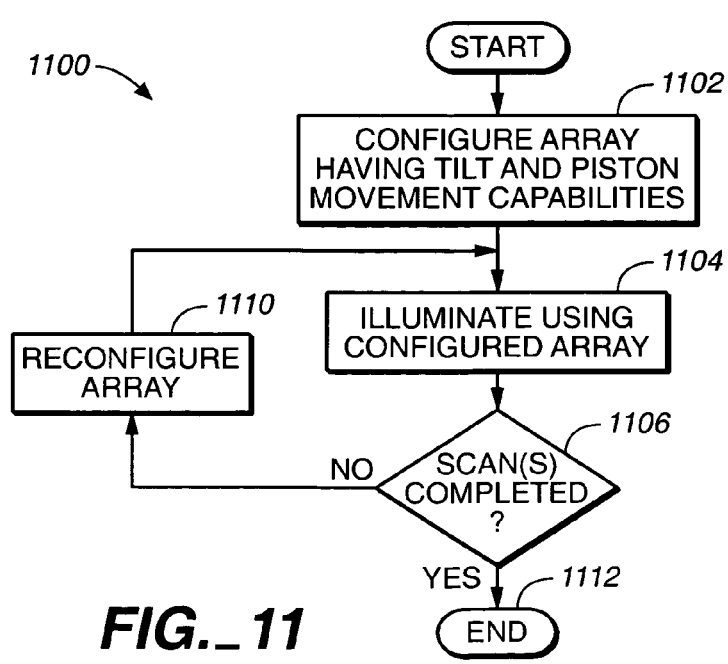
FIG._11

PROCESS AND APPARATUS FOR GENERATING A STRONG PHASE SHIFT OPTICAL PATTERN FOR USE IN AN OPTICAL DIRECT WRITE LITHOGRAPHY PROCESS

CROSS-REFERENCE TO RELATED APPLICATIONS

This application claims priority of U.S. Provisional Patent Application No. 60/513,780, filed 22 Oct. 2003, which application is incorporated herein by reference in its entirety for all purposes.

This application also claims priority of U.S. Provisional Patent Application No. 60/535,586, filed 1 Jan. 2004, which application is incorporated herein by reference in its entirety for all purposes.

This application also claims priority of U.S. Utility Patent Application Ser. No. 10/825,342, filed 14 Apr. 2004, which application is incorporated herein by reference in its entirety for all purposes.

FIELD OF THE INVENTION

The present invention relates to methods and apparatus for forming patterns on substrate surfaces. More particularly, the present invention relates to methods for directly writing patterns onto a wafer to create semiconductor devices on the wafers or writing patterns onto substrate to form a reticle.

BACKGROUND

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). To meet these requirements, semiconductor manufacturers have been forced to build new fabrication lines at the next generation process node (gate length). As the critical dimensions for these devices grow smaller, greater difficulties will be experienced in patterning these features using conventional photolithography.

Conventional photolithography methods used for pattern generation involve exposing a light sensitive photoresist layer to a light source. The light from the source is modulated using a reticle, typically a chrome on quartz mask. The patterns formed on the reticle are transferred to the photoresist layer using typically visible or ultraviolet light. The areas so exposed are then developed (for positive photoresist) or, alternatively, the unexposed areas are developed for negative type photoresist. The developed regions are then washed away and the remaining photoresist pattern used to provide an etching mask for the substrate.

One approach to achieving the desired critical dimensions has been to use attenuated phase shift masks and strong phase shift masks. Although useful such masks suffer from a number of shortcomings. For one, a mask set for such phase shift masks takes a long time to make. Sometimes these mask sets can take thirty days or longer to manufacture. Additionally, such mask sets are particularly vulnerable to defects which can have catastrophic effects on the reticle yield. Also, due to the etch processes used in making such masks, there are numerous non-uniformities in surface conformation. These result in unwanted and unexpected diffraction and scattering patterns which interfere with and corrupt the desired light pattern produced with these masks. Additionally, the interactions between light and the sidewalls present in such masks create their own wave patterns which interfere with and corrupt the desired light pattern produced with these masks. Additionally, because such phase masks require at least two exposures per layer and because many process layers are commonly used to form modern semiconductor structures, alignment difficulties between the masks and the wafer comprise significant process complications. Additionally, imperfections in mask feature size, feature placement, phase, or transmission cannot be easily inspected and repaired.

These complications result in costs that are disproportionate to the costs involved in other aspects of the chip fabrication. This is particularly significant when the chip is an application specific integrated device with only a small production lot desired. Additionally, it is a substantial effort to make small changes in the design once the masks are fabricated. This is particularly important because often the design of the chip must be modified after testing of chips produced from the first mask set. This results in additional expenditures for second, third, and even more sets of masks. Finally, with the reduction in feature sizes, various process limitations in the conventional lithography process have made IC fabrication more difficult.

X-ray and electron beam lithography have been proposed (and adopted in some instances) for imaging very small features. This is because the radiation employed in these techniques has much shorter wavelengths than the ultraviolet radiation employed in conventional photolithography. However, x-ray lithography has found only limited acceptance because of mask, source and resist technology problems. Sources have not been sufficiently bright, and resists have not been adequately sensitive or process-resistant. Further, x-ray masks can be complex to manufacture and current process difficulties (such as the presence of a non-zero mask to wafer gap) do not permit resolution consistent with the theoretical limits set by wavelength. For at least these reasons, x-ray lithography has not gained widespread acceptance.

Electron-beam lithography (referred to herein as e-beam lithography) has also been proposed. E-beam lithography involves exposure of a radiation sensitive film to a beam of focused electrons in a vacuum, followed by development of the resist film, and subsequent etching. Thus, e-beam lithography includes the basic steps of conventional lithography, but substitutes a scanning electron beam for an ultraviolet source and reticle. Unfortunately, the imaging step of e-beam lithography is relatively slow. Rather than exposing an entire IC to an image in one shot (as is done in conventional optical lithography), e-beam lithography requires that an electron beam be scanned over the IC wafer surface in a rasterized fashion. To produce a thin line, an e-beam sometimes must be scanned over the line multiple times because the beam size is quite small. This combination of raster scanning and multiple passes requires a long time to produce a pattern image. Thus, e-beam lithography fabrication processes have a relatively low throughput.

Thus, the numerous present art lithography and chip fabrication processes have numerous disadvantages. As critical dimensions decrease these problems and the costs inherent in solving them will only increase.

In view of the above difficulties, what is needed is a relatively fast and inexpensive approach for transferring images of very thin line width to a wafer. In other words, an effective solution to rising mask costs and processing difficulties is needed.

SUMMARY OF THE INVENTION

To achieve the foregoing, the present invention provides a direct write lithography system using reconfigurable optical mirrors used to generate strong phase shift optical exposure patterns which are directed onto a substrate to facilitate an optical lithography process.

The present invention provides an optimized direct write lithography system using optical mirrors. That is, a maskless lithography system is provided. The maskless direct-write lithography system of the present invention uses an array of mirrors configured to form strong phase shift optical patterns which can be projected onto a substrate surface to achieve pattern transfer of the optical pattern onto a surface of the substrate. Generally, this surface includes a thin layer of photo-imageable material (e.g., photoresist materials) onto which the optical pattern is projected. Additionally, the maskless lithography system generates strong phase shift optical patterns using an array of mirrors configured to operate in at least one of a tilted (torsional) mode, a piston-displacement mode, or both in combination. The controlled mirror array is used as a substitute for the traditional chrome on glass mask. In order to avoid constraining the system to forming edges of patterns aligned with the array of mirrors, gray-scale techniques are used for subpixel feature placement. The direct-writing of a pattern may rely on a single mirror mode or a combination of modes. By using the proposed inventive system, light from a source may be modulated in both phase and magnitude to suit the desired pattern. The maskless lithography provided by the embodiments of the present invention reduces the costs for design iterations. Hence, the incremental costs of design iteration are reduced.

A method embodiment of the invention involves providing a mirror array comprising a plurality of mirrors capable of operating as piston mirrors or tilt mirrors. These mirrors are configured to form desired phase interference patterns. The mirror array is illuminated to form a resultant image pattern having the desired phase interference pattern which is directed onto a substrate exposing a photosensitive layer of a substrate.

In another method embodiment the invention of forms patterns on a semiconductor wafer. The method involves modulating light directed to a portion of a photosensitive layer using a plurality of mirrors in a mirror array wherein the mirrors can be configured as piston mirrors. The piston mirrors are arranged so that some of the mirrors of the array are displaced relative to other mirrors in the array to create varying degrees of interference in light waves reflected by the mirror array to form an phase interference exposure pattern that is directed onto the photosensitive layer, the amount of interference in the exposure pattern being associated with the degree of displacement of the mirrors.

In another embodiment the invention includes a maskless lithography system. The system includes a mirror array with a plurality of movable mirrors that can operate in a piston displacement configuration and control element capable of configuring the mirrors in a desired configuration. The system includes an illumination source for directing electromagnetic waves to the mirror array to generate an exposure pattern that is projected onto a substrate. A stage is used to move the substrate facilitating the exposure of the substrate to the exposure pattern.

These and other features and advantages of the present invention are described below with reference to the drawings.

BRIEF DESCRIPTION OF THE DRAWINGS

The following detailed description will be more readily understood in conjunction with the accompanying drawings, in which:

FIGS. 1(a) and 1(b) are schematic diagrams illustrating optical direct write systems in accordance with example embodiments of the present invention.

FIG. 2 is a schematic diagram illustrating a raster pattern for scanning a wafer using the system illustrated in FIG. 1.

FIG. 3 is a schematic diagram illustrating the mirror array of FIG. 1 arranged in a neutral position.

FIG. 4A is a schematic diagram illustrating a mirror array arranged with adjacent mirrors in a tilted configuration, in accordance with one embodiment of the present invention.

FIG. 4B is a schematic diagram illustrating an optical pattern generated by a mirror array arranged as in FIG. 4A, in accordance with one embodiment of the present invention.

FIG. 5 is a schematic diagram illustrating the mirror array arranged with adjacent mirrors displaced in a direction normal to the plane of the mirror array, in accordance with one embodiment of the present invention.

FIGS. 6A–6F are schematic diagrams illustrating mirror arrays and configurations arranged to produce various strong phase shift optical patterns and one example of a resultant exposure pattern in accordance with embodiments of the present invention.

FIG. 7 is a schematic graph diagram illustrating aspects of a strong phase shift implementation constructed in accordance with the embodiments of the present invention.

FIG. 8 is a schematic depiction of a graduated displacement mirror configuration used to implement gray-scaling or off grid feature movement in accordance with the embodiments of the present invention.

FIG. 9 is a depiction of one embodiment of a piston mirror implementation used to illustrate advantages of some embodiments constructed in accordance with the principles of the invention.

FIGS. 10A–10D are schematic depictions of mirror array configurations and the resultant optical patterns generated thereby for semiconductor fabrication in accordance with embodiments of the invention. In particular some trim mirror configurations are schematically depicted along with associated optical patterns generated thereby in accordance with embodiments of the invention.

FIG. 11 is a flow chart illustrating operations in performing direct write optical lithography using mirror arrays, in accordance with one embodiment of the present invention.

It is to be understood that in the drawings like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

In the following detailed description, fabrication methods and apparatus for implementing direct write optical lithography systems is set forth. Such systems and methods use programmable optical mirrors in a maskless lithography system to form desired optical patterns on a substrate. The maskless direct-write lithography system provided uses an array of mirrors configured to operate in a torsional (i.e., tilted) mode, a piston-displacement ("piston") mode, or capable of operating in both modes. A scanning apparatus is provided that uses the mirror array to reflect light onto either a wafer or other substrate (for example, a reticle) covered with a layer of photoimageable material. Such photoimageable materials include a range of photosensitive materials (e.g., photoresist). In order to avoid constraining the system to forming edges of patterns aligned with the array of mirrors, gray-scale techniques can be used for sub-pixel feature placement. The direct-writing of a pattern may rely on a single mirror mode or a combination of modes. By using the proposed inventive system, light from a source may be modulated by combining the phases from adjacent mirrors in a customized fashion for the desired pattern. The individual mirrors are controlled to implement the above-referenced gray scale techniques.

The present invention uses an array of mirrors that can be operated in a piston mode, or in a tilt mode, or both to introduce phase differences into an optical signal which is projected onto a target substrate to form an image pattern that is used to establish patterning of a photosensitive layer formed on the substrate. In some embodiments the mirrors are programmable (i.e., the mirrors can be actuated using a controller) allowing the system to individually (or collectively) orient mirrors to introduce a light path difference (i.e., across the mirrors) resulting in a phase difference that enhances contrast in a resultant image. The present invention can use the mirror array to produce resultant images that are binary in nature (i.e., produce a pattern of light and dark that is largely analogous to the configuration of the mirror) or alternatively the mirrors can be implemented in piston configuration to generate a strong phase shift pattern that is projected onto a photosensitive layer formed on a target substrate. In specific, a combination of fixed piston driven mirrors and tilted mirrors can be used to control the light flux on the photosensitive layer. The techniques and systems of the embodiments of the present invention may be used, for example, to directly form patterns on photoresist layers such as those deposited on wafers. In addition, the pattern generation techniques disclosed may extend to other applications, for example including, the exposure of photoimageable layers on reticle substrates (e.g., glass, quartz, Si or SiN membranes (such as can, for example, be used in x-ray lithography, as well as ion and electron projection), and so on) in order to form the reticle patterns.

FIG. 1 is a simplified schematic diagram illustrating one possible implementation of an optical direct write system in accordance with one embodiment of the present invention. The system 100 uses the mirror array 102 to modulate the light flux from the illumination source 108. The illumination source 108 may be any illumination source capable of generating electromagnetic waves sufficient to reflect from the mirror array 102 and to induce chemical changes in a photosensitive layer on the wafer 104. Preferably the illumination source 108 is an intermittent source, capable of exposing the wafer during selected periods of a continuous scan movement of the light beam relative to the wafer. In some embodiments the intermittent source can be provided by chopped light from a continuous source or an electrically pulsed source. While the intermittent source is "off", the mirrors of the mirror array can be reconfigured (moved and allowed to settle). In one typical implementation, the mirrors can be reconfigured to correct pattern drift. Commonly (but not exclusively), the illumination source 108 is a coherent light source. In one embodiment the illumination source 108 is an ArF excimer laser producing 193 nm (nanometer) output. Typically, the light from the source 108 is directed onto a mirror array 102 and projected onto the target substrate (here target wafer 104) using beam splitters 110, 114. As is known to those of ordinary skill many possible arrangements can facilitate projecting a desired light pattern onto the substrate in accordance with the principles of the invention. For example, the source 108 can be moved and the optics (e.g., 110, 114) can be reconfigured or optical elements can be deleted or added.

Further details as to the mirror array 102 will be provided later in this description. Preferably, each of the individual mirrors in the mirror array is responsive to control signals provided at each point in a scan of a wafer. Additionally, each of the mirrors can be programmably actuated using, for example, a mirror array control element 111. Such a control element 111 can use software to actuate the individual mirrors of the array 102 to produce a desired optical pattern, which is then projected onto a target substrate (here wafer 104) to produce a desired image. As alluded to above, the light 109 from the illumination source 108 may be directed to the photosensitive wafer 104 by any suitable means as known to those of skill in the relevant art. In accordance with one embodiment, the mirror array 102 comprises a plurality of mirrors, each of the plurality of mirrors having a very small size. For example, mirrors having sides on the order of about 8 µm (micrometer) can be used. The inventors specifically point out that other sizes of mirrors can be used. These mirrors can be demagnified to a final pixel size of about 30 nm on a side (at the image plane e.g., on the photosensitive layer of the wafer 104). Such demagnification can be accomplished using a number of lens elements 112 such as known to those having ordinary skill in the art. Preferably, such demagnification is accomplished so that each of the plurality of mirrors corresponds to a pixel imaged on the wafer.

FIG. 1(b) depicts another example embodiment in accordance with the principles of the invention. The simplified schematic diagram depicted in FIG. 1(b) shows a system 101 uses a programmable mirror array 102 to modulate the light flux from the illumination source 108. The illumination source 108 is, as discussed above, any source capable of exposing the photosensitive layer of the wafer 104. Although not limited to such, the inventors contemplate that intermittent illumination sources can be used. As mentioned above, the illumination source 108 can be a coherent light source. Also, filtered light sourced can be used (e.g., an I-line source). In the depicted embodiment, light 109 from the source 108 is directed onto a mirror array 102 and projected onto the target substrate (here target wafer 104 placed on stage 106).

As described herein, each of the individual mirrors in the mirror array 102 are responsive to control signals provided by a mirror array control element 111. Such a control element 111 can use software to actuate the individual mirrors of the array 102 to produce a desired optical pattern, which is then projected onto a target substrate (here wafer 104) to produce a desired image. As alluded to above, the light 109 from the illumination source 108 may be directed to the photosensitive wafer 104 by any suitable means as known to those of skill in the relevant art. In accordance with the depicted embodiment, the light reflected by the mirror array 102 can be demagnified (e.g., using demagnification optics 113) to a final pixel size. As depicted, the demagnification optics 113 can be located at a number of different locations within the system 101. This signal is also directed. (e.g., using a beam splitter 115) into projection optics 116 which direct the optical signal onto the wafer 104.

Although the apparatuses illustrated are of catadiotropic configurations, the scope of the invention is not so limited. That is, any configuration which allows the use of mirror arrays to direct light to a substrate is expected to be suitable and thus within the scope of the invention. The scope of disclosure particularly includes, but is not limited to, configurations that allow the use of mirror arrays to direct light onto a substrate through catadioptric or refractive mirror demagnification optics and through catadioptric or refractive projection optics.

FIG. 2 is a schematic diagram illustrating one pattern for scanning a wafer using the system illustrated in FIG. 1. Although the scanning pattern depicted is a raster scanning pattern the invention is not limited to such. The scanning system is configured to preferably scan the wafer by suitable movement of the stage 106 illustrated in FIG. 1. Preferably the scan is a continuous movement with the exposure for each pixel position occurring within a short time period. Thus, due to the short duration of the source light, despite the continuous movement of the stage mounted wafer, the light is effectively a flash exposure and exposes the photosensitive layer on the wafer 200 in only those selected areas of the wafer corresponding to the current configuration of the mirror array. The raster pattern 204 illustrated in FIG. 2 results from the control of the stage movement and control of the light source. It is to be appreciated that any suitable light source capable of providing light in intermittent periods will be suitable. Again suitable sources 108 are known to those of skill in the relevant art and include intermittent sources such as excimer lasers as well as continuous sources operated in conjunction with a shutter or blanker.

The mirror array 102 illustrated in FIG. 1 preferably comprises a plurality of mirrors, the individual mirrors preferably capable of operating in a tilting mode, a piston mode, or a combination of the two modes. In the tilting mode, each individual mirror is controlled by electrostatic voltages applied to electrodes to control the degree of tilt in an analog fashion. The actual tilting of the individual mirror may be constrained to several degrees of movement in either direction from the neutral "flat" position by the physical configuration of the mirrors and the mirror array. However, even this limited movement is sufficient to alter the phase of the mirrors such that adjacent mirrors can be configured to provide controlled interference and accordingly vary the amount of light reaching the photosensitive region of the wafer. This results in enhanced contrast. It should be noted that for illustrative purposes the configuration and use of the mirror array are described in the context of a system applying a pattern to a photosensitive region of the wafer. However, the invention scope is not so limited. The scope of the invention is intended to extend to transfer of patterns to any photosensitive layer, for example to include the formation of patterns on photo masks or reticles.

Structures and operational use of tilted and mirror arrays are known in the art and thus further detail here is deemed unnecessary. For example, the use of piston and tilted mirrors is described in "Optical Analysis of Mirror-Based Pattern Generation" by Y. Shroff, Yijian Chen, and W. G. Oldham; Proceedings of SPIE, Vol. 5037 (2003), the entire disclosure of which is incorporated herein by reference for all purposes.

As a further example, integrated circuits comprising microelectronic mirror devices are available commercially. For example, Texas instruments, Inc. of Dallas, Tex. produces a Digital Micromirror Device (DMD) comprising an array of microscopically small square mirrors, each mirror corresponding to a pixel in the projected image. The individual micromirrors are hinged, allowing rotation on a diagonal axis, approximately +/− 10 degrees from a neutral position.

Although in one embodiment the direct-writing of the wafer is performed in one pass, a preferred embodiment uses 2 or more passes to average the values. That is, multiple passes provide better control of dose and corrections for asymmetry in the image and correction for image placement error. It should be noted that although tilt mirror configurations present an improvement over standard binary mask lithography, the introduction and use of the mirror array as a piston mirror array to generate a strong phase shift optical pattern results in contrast improvements that are nearly twice as great for piston-mirror implementations as for tilt-mirror implementations. This advantages of such an implementation are obvious but will be discussed in greater detail elsewhere.

FIG. 3 schematically illustrates one embodiment of a mirror array 300 suitable for use as mirror array 102 of FIG. 1. The depicted array 300 is depicted as arranged in a neutral position, in accordance with one embodiment of the present invention. That is, the mirror array 300 illustrates one configuration of individual mirrors 302. The individual mirrors 302 are shown in a coplanar position with the plane of the mirror array 300, thus reflecting incident light back in a direction normal to the plane of the individual mirrors 302 (as well as the plane of the mirror array 300). In this particular configuration, the incident light is reflected and directed to the corresponding pixel of the wafer 104. Accordingly, with the use of a negative photoresist layer on the wafer 104, the exposed region will be converted and left in place (on the photoresist layer) for subsequent etching operations. It is to be understood that this neutral position may be achieved by supplying suitable electrostatic potentials to electrodes corresponding to the individual mirrors as known to those of skill in the relevant arts. In contrast, in order to form a trench in the wafer, the mirrors require an adjustment (in tilt) such that an absence of light appears on the selected portion of the photosensitive resist on the wafer, thus allowing the resist in the selected area to subsequently be dissolved followed by etching using the patterned resist layer. Generally, dark areas correspond to complete interference (tilting). In such an implementation the mirror array emulates the performance of a binary mask. For example, mirrors remaining coplanar (i.e., un-tilted) direct light onto the substrate 104, whereas tilted mirrors correspond to dark spots on the substrate 104. Thus, the mirror pattern looks much the same as the optical pattern formed on the substrate (i.e., tilted mirrors dark, un-deflected mirrors light). Commonly, the mirrors are formed of aluminum or silicon with a top layer formed of aluminum. However, any suitably reflective materials can be employed. Moreover, for mirrors having two or more layers any suitably stiff material may be used as a mirror underlayer with suitably reflective materials employed as overlayer(s).

The present invention, in various embodiments, may be configured to direct light to a substrate such as a wafer by tilting the mirrors, arranging the individual mirrors in piston-displaced positions, or for optimal contrast according to yet another embodiment configuring the individual mirrors to have both tilt and piston displacement. Each of the FIGS. 4–7 illustrate example configurations for the mirror array in order to introduce phase differences into the direct write printing process and thus to effectuate printing of features.

While illustrative, these configurations are not intended to limit the scope of the present invention.

FIG. 4A is a schematic diagram illustrating the mirror array of FIG. 1 arranged with adjacent mirrors in a tilted configuration, in accordance with one embodiment of the present invention. Specifically, this diagram illustrates the mirror array 400 having an alternating row tilt configuration. Preferably, the individual mirrors are configured to operate in a plurality of positions, each of the positions or states corresponding to a different angular rotation of the mirror. That is, a variable voltage may be applied to the electrodes to operate the mirror in an analog mode. Moreover, it is preferable that the spaces between the mirrors is small in comparison to the surface area of the mirrors.

More specifically, mirrors 412 and 422 are shown tilted in a first direction, the direction depicted by vectors 451 and 453. The second row of mirrors, i.e., mirrors 414 and 424, are shown tilted in a second direction, opposite to that of the first direction. It is understood that in accordance with embodiments of the present invention, each of tilting or vertically displaced individual mirrors operate to alter the phase of the light impinging on the mirrors when combined with light impinging on adjacent mirrors. For the tilted mirror configuration, the tilting introduces an optical path difference across the mirrors that enhance contrast. The optical path difference results in an interference effect due to the phase difference of the light. In the alternating row tilt configuration shown, the phase varies with the distance from the axis of rotation of the mirror. For instance, the phase of the light beam striking the raised edge portion 461 of mirror 412 is advance relative to the phase at the center of rotation 460 (i.e., at the center of the mirror)) and even more advanced relative to the phase at the lowered edge 462. In the alternating row, i.e., the row including mirrors 404, 414, 424, and 434 the tilted mirrors 414 and 424 are tilted in the second direction. This results in impinging light beams reflected in directions 455 and 457. Assuming that each mirror in the mirror array corresponds to a pixel on the image (e.g., the wafer), for the tilted configuration, the degree of phase difference achievable depends on the tilt of the mirror and the tilt of the adjacent mirrors. For example, the phase difference of light waves reflected from different portions of the individual mirror may vary from 260 degrees at edge 461 to 0 degrees at the axis of rotation 460 to −260 degrees at edge 462. Given that mirror 422 is aligned in a similar direction, the phase difference between light reflected at the upper edge 461 of mirror 412 and the lower edge 465 of mirror 422 is enhanced. This configuration provides optimal results for a single pass process FIG. 4B is a schematic diagram showing a possible photoresist pattern after exposure and development. The exposure of the photoresist (here a positive photoresist) being conducted, for example, by exposing the mirror array with an illumination source when the mirror orientation depicted in FIG. 4A is implemented in a direct write application of the present invention. The optical pattern formed on the substrate 470 includes a dark line 471 that corresponds to the interference pattern formed by mirrors 412, 422, 414, 424, 416, 426, 418, 428, and so on. Moreover, the dark line 471 is approximately 60 nm wide. Thus, there is a nearly one to one correlation between the mirror pixels and the image projected onto the substrate. Likewise, the illuminated portions correspond to the undeviated mirrors 402, 432, 404, 434, 406, 436, 408, 438, and so on. Thus, mirrors arranged to produce patterns that correspond with those of FIGS. 4A and 4B are considered binary mask analog patterns.

FIG. 5 is a schematic diagram illustrating the mirror array of FIG. 1 arranged with adjacent mirrors displaced in a direction normal to the plane of the mirror array, i.e., in a piston mode, in accordance with one embodiment of the present invention. More specifically, FIG. 5 illustrates an alternating row piston mirror array. That is, mirrors 512, 516, 524, and 528 are shown with the mirrors displaced in a vertical direction from the neutral position, i.e., the position shown by mirrors 502, 504, 506, 508, 532, 534, 536, and 538. In turn, mirrors 514, 518, 522, and 526 are shown with the mirrors displaced at a level below the neutral position. This configuration yields phase differences between adjacent pixels similar to that shown by the alternating row tilt array described above. In some embodiments the displacement between the raised mirrors (e.g., 512, 516, 524, and 528) and the lowered mirrors (e.g., 514, 518, 522, and 526) is set to induce the maximum phase interference (e.g., at or near 180°) in the reflected light. The displaced piston mirrors in the embodiments of the invention are maintained in a substantially parallel orientation to the mirrors in the neutral plane.

Again referring to FIG. 4B, a similar optical pattern is formed by the mirror arrangement of FIG. 5. Again, the exposed and developed pattern of photoresist (here, positive) formed on the substrate 470 forms a dark line 471 that corresponds to the interference pattern formed by mirrors 512, 522, 514, 524, 516, 526, 518, 528, and so on. Moreover, the dark line 471 is again approximately 60 nm wide (this can be varied with dose as well as by varying the number of mirror rows displaced from the neutral position). As before, there is a nearly one to one correlation between the mirror pixels and the image projected onto the substrate. Likewise, the illuminated portions correspond to the mirrors that remain in the original plane. Thus, the pattern of FIG. 5 is also considered a binary mask analog. These and other tilt and piston mirror configurations can be used to generate binary analog optical patterns. Methods and configurations for generating such binary analog optical patterns are disclosed in greater detail in, for example, U.S. Utility patent application Ser. No. 10/825,342, filed 14 Apr. 2004, entitled "Optimized Mirror Design for Optical Direct Write" which has previously been incorporated by reference.

In order to enable a strong phase shift optical pattern to be formed in accordance with the principles of the invention the mirror array typically is configured as illustrated in FIG. 6A. FIG. 6A depicts a portion of a mirror array 600. There, a first group of mirrors 601 is displaced above the neutral position N and also a second group of mirrors 603 is displaced above the neutral position N. Also a third group of mirrors 602 is displaced below the neutral position N. All mirrors are normal to the plane of the neutral position i.e., this is not a tilt mirror configuration. The displaced groups of mirrors extended in either direction (not shown in this view). Additionally, the left of the first set of mirrors 601 includes a plurality of mirrors configured so that they remain in the neutral plane. Also, the right of the third set of mirrors 603 includes a plurality of mirrors configured so that they also remain in the neutral plane. Such a configuration is designed to form two "lines" (i.e., dark features) about 180 nm apart (i.e., the distance between six 30 nm pixels). A schematic depiction of the resultant optical pattern 610 is depicted in FIG. 6B. Two dark features 611, 612 separated by an exposed (light) region 613 about 180 nm apart are formed on the surface of, for example, a photosensitive layer.

FIG. 6C depicts a schematic cross-section view of one row of mirrors as depicted in, for example, FIG. 6A. The neutral plane N is depicted as well as mirrors 607, 608 in the neutral plane. The upwardly displaced mirrors 601, 603 and the downwardly displaced mirrors 602 are also depicted.

Another implementation is schematically depicted in FIG. 6D. FIG. 6D depicts a schematic cross-section view of a mirror configuration designed to generate a single line. The neutral plane N is depicted as well as mirrors 617, 618 in the neutral plane. The upwardly displaced mirrors 621 and the downwardly displaced mirrors 622 are also depicted. The interface 625 between the upwardly displaced mirrors 621 and the downwardly displaced mirrors 622 is also depicted. The position of the line will correspond generally to the position of the interface 625. This will be discussed in greater detail hereinbelow. Line widths of about 50 nm to about 150 nm can easily be formed by controlling the exposure dose. Additionally, in an implementation using negative photoresist, greater doses can be used to achieve line widths of 200 nm and greater if desired. In other implementations, an alternating sets of adjacent mirrors configured with a 180 degree phase differences (i.e., configured so that light reflected from each of a first set of mirrors is 180 degrees out of phase from light reflected by a second set of adjacent set of mirrors, which is 180 degrees out of phase from light reflected by a third set of adjacent (to the second set) set of mirrors, and so on) relative to adjacent mirror sets can be used to generate such lines. Also, for wide lines binary analog patterns can be used.

Also, line pitch of sub-wavelength resolutions can also be generated. For example, by using the mirror array in a piston mirror implementation and using a mirror pattern designed to generate a strong phase shift optical pattern line pitches of on the order of 150 nm or less can be achieved. For example, using the schematic depiction of FIG. 6E a suitable phase difference (e.g., about 180 degrees) can be induced at the mirror interfaces 627, 628 between three groups of mirrors. If for example, the mirrors are exposed with 193 nm source having a relative low NA (e.g., less than about 0.70) and with a low σ(e.g., on the order of 0.50 or less) a five mirror alternating pattern can achieve a 150 nm pitch width 626 as schematically depicted in the optical pattern 629 of FIG. 6F FIG. 7 is a schematic graphical depiction 700 of an implementation of a strong phase shift optical pattern in accordance with an embodiment of the invention. Image intensity 701 is graphed as a function of distance 702 from a centerline for a feature formed in accordance with an embodiment of the invention. In the depicted embodiment, the feature is a line formed by elevating one group of piston mirrors above a neutral plane and lowering an adjacent group of piston mirrors below the neutral plane. This is depicted on the graph containing a cartoon depiction of one line of mirrors (in a much larger set of similarly configured mirrors) having an elevated group of piston mirrors 711 and an adjacent set of lowered piston mirrors 712. The mirror cartoon in the graph does not necessarily correspond with the graph's x-axis. A table of data is integrated into the graph. The table categorizes a series of lines 721–727 relating intensity versus distance (from centerline). Additionally, the table relates the mirror displacement from the neutral plane in terms of phase of the reflected light. For example, $\Phi_1$ relates to the displacement of the mirrors 711 above the neutral plane. Also, $\Phi_2$ relates to the displacement of the mirrors 712 below the neutral plane. SWR is standing wave ratio and is a representation of the contrast achieved by the mirror pattern. As is known by those of ordinary skill a higher SWR is more desirable that a low SWR because greater contrast is achieved. As can be seen from line 721, when there is no displacement of the mirrors ($\Phi_1$ and $\Phi_2$ both equal zero) then there is no drop in signal intensity at the desired location in the optical pattern. Thus, there is no phase effect and therefore and no ability to form a pattern on the substrate. The mirror array is essentially functioning as an ordinary mirror.

Line 722 shows that when the mirrors are slightly displaced relative to neutral (e.g., $\Phi_1$+20° and $\Phi_2$-20°) then there is a drop in signal intensity at the desired location in the optical pattern (i.e. X=0). However, the signal is significantly unbalanced with the signal on the left having an intensity of about 0.85 and the signal on the right having an intensity of about 0.7. Additionally, there is a shifting of the point of lowest intensity. In line 722 this point is shifted about 20 nm to the right. Ordinarily this is an undesirable feature. However, the inventors have determined that this aspect of the invention can be used to move a (for example a line) feature on the optical exposure pattern if desired. This will be discussed in greater detail below.

Line 723 shows the intensity behavior when the mirrors are a little bit more displaced (e.g., $\Phi_1$=+40° and $\Phi_2$=-40°). As depicted there is a greater drop in signal intensity at the desired location in the optical pattern (i.e. X=0). However, the signal is still significantly unbalanced with the signal on the left having an intensity of about 0.87 and the signal on the right having an intensity of about 0.65. Again, there is a shifting of the point of lowest intensity although such shifting is less pronounced than in 722. Again, this aspect of the invention can be used to move a feature on the optical exposure pattern if desired.

Lines 724 and 725 shows the intensity behavior when the mirrors are still more displaced (e.g., $\Phi_1$=+60° and $\Phi_2$=-60° or $\Phi_1$=+80° and $\Phi_2$=-80° respectively). As indicated there is increasing drop in signal intensity at the desired location in the optical pattern as the patterns improve for ideal feature placement at X=0. However, the left and right signals are still unbalanced. As before, there is a shifting of the point of lowest intensity although such shifting is greatly reduced.

Line 726 shows the intensity behavior when the mirrors demonstrate nearly equal phase displacement of ±90° (i.e., total differential displacement between the adjacent mirrors of 180°). This should yield a nearly ideal destructive interference pattern. This borne out by the lowest signal intensity at the zero point in the optical pattern. Additionally, the signal is nearly perfectly balanced. This is the amount of mirror displacement when the desired feature is to be placed at X=0. As is known to those having ordinary skill in the art a 180° phase shift yields maximum destructive interference. In accordance with the principles of the invention this 180° phase difference in reflected light can be achieved in a number of ways. For example, where the mirrors demonstrate a nearly equal phase displacement of ±90° above and below a "neutral" plane. Also, the mirrors can produce maximum destructive interference if a first mirror is at +220° above the "neutral" plane and wherein an adjacent second mirror is at +40° above the "neutral" plane. What is important is the 180° phase difference in reflected light. Thus, any arrangement capable of producing the 180° phase difference in reflected light is effective in accordance with the principles of the invention.

If we keep going and introduce still further displacement a further pattern emerges. Line 723 shows the intensity behavior when the mirrors are a little bit more displaced (e.g., $\Phi_1$=+100° and $\Phi_2$=-100°). As depicted there is a slight lessening in signal intensity at the zero point in the optical pattern. Additionally, the signal becomes unbalanced with the signal on the right having greater intensity than the signal on the left. As before, there is a shifting of the point of lowest intensity although such shifting is to the left now. Again, this aspect of the invention can be used to move a feature on the optical exposure pattern if desired.

Mirrors altering the phase of the impinging light have been shown to have higher standing wave ratio (SWR) as the combined displacement approaches 180°. The SWR is defined for an image formed on the wafer as the signal intensity (max−min)/(max+min)×100. That is, the SWR is a measure of the contrast at the wafer level. Higher values result in increased resolution and larger process windows.

As alluded to before, unbalanced mirror displacement can be used to move features in the optical image (and hence on the surface of the target substrate). This process is referred to gray scaling or as optical proximity correction (OPC) which is typically used to make patterned lines of the circuit on the printed wafer less sensitive to changes in lithographic process parameters such as focus and dosage. Such gray scaling can be achieved by configuring the mirrors to produce less than the maximum interference in the illuminating light thereby shifting the resultant image pattern. This increases the process window. Thus, resolution enhancement features such as might appear typically as serifs or hammerheads on the glass mask can be mimicked using the mirror array in a piston type displacement configuration. Accordingly, in accordance with one embodiment of the present invention, during the course of the scan of the wafer the individual mirrors are reconfigured in a tilt arrangement, a piston arrangement, or a combination of the two.

In one implementation OPC can be achieved by simply reversing the displacement of the relevant mirrors. For example, in a first arrangement, a first set of mirrors has a phase displacement of +90° above the "neutral" plane and a second set of mirrors has a phase displacement of −90° below the "neutral" plane. This will produce some degree of pattern shifting and can produce certain pattern distortion. However, this can be easily corrected by simply reversing the displacement of the mirrors. For example, a second mirror arrangement with the first set of mirrors having a phase displacement of −90° below the "neutral" plane and with the second set of mirrors having a phase displacement of +90° above the "neutral" plane can be used to correct for these effects. Conveniently, in some implementations, the mirror arrangements can be reconfigured during the "flashes" of an intermittent exposure source. Thus, the mirror arrangements can be toggled back and forth a number of times during an exposure process. This can effectively achieve OPC.

Additionally, in an embodiment where the mirrors are deviated at some displacement other than ±90° the displacement "polarity" can simple be reversed in order to conduct such correction. For example, in one arrangement, the first set of mirrors is displaced of +110° above the "neutral" plane and the second set of mirrors is displaced −70° below the "neutral" plane. In order to effect correction the displacement of the mirrors can be reversed. For example, the mirror arrangement is changed so the first set of mirrors has a phase displacement of −110° below the "neutral" plane and the second set of mirrors has a phase displacement of +70° above the "neutral" plane. As described above, the mirror arrangements can be toggled during the "flashes" of an intermittent exposure source.

In other embodiments, rather than changing the displacement for all the mirrors in a bank of mirrors as described with respect to FIG. 8. Graduated mirror configurations can be implemented. For example, referring to FIG. 8 the magnitude of the displacement can be progressively reduced for end mirrors 801', 802' of banks of mirrors 801 and 802 to effectuate a gray-scaling of the optical pattern in order to move features of the pattern. In this way the lines and features of a pattern can be moved "off-grid" to capture configurations not possible with a rigid implementation of a phase shift pattern.

Suitable mechanisms for providing both tilting and mirror displacement functions have been described in the art, for example using a hinge positioned on one side of the individual mirror. For example, in one device the dual purpose array is constructed by using a hinge on the face of the piston mirror, the tilting and deflection (displacement) are controlled by electrostatic forces. Beneath the piston are ribbons for controlling electrostatic movement. Suitable mirrors for use in semiconductor patterning applications are expected to be in the range from 1 to 16 microns, more preferably 1 to 4 microns. In some embodiments, mirrors are configured with both tilt and piston displacement for their enhanced contrast performance.

One attribute of such piston mirror structures (and tilt mirrors as well) is that they avoid substantially all of the artifacts (e.g., standing wave patterns and unwanted diffraction) generated by an etched wall of an ordinary phase shift mask. This is simply because such constructions do not have walls. For example, reference is made to FIG. 9 which depicts one type of piston mirror embodiment 900 constructed in accordance with the principles of the invention. Where the walls of an ordinary phase shift mask would be (e.g., 901) there is only space. Thus, no standing wave patterns or other electromagnetic interference or artifacts are generated by the walls. Additionally, as stated above, etched phase shift mask have extensive surface roughness at the bottom of each etched feature. These etched bottoms are rough and have unpredictable light scattering properties which degrade the phase shift attributes of the mask. Because, the present invention uses mirrors and not etched surfaces, the bottoms 902 of these wells are highly. reflective and exhibit very few of the problems inherent in the prior art etched bottoms.

FIG. 10A is a schematic depiction of a portion of a mirror array 1000 configured to generate a pattern having two parallel lines on a substrate. In the depicted embodiment, a first 1001 and third 1003 bank of mirrors is displaced upward from a neutral plane and a second bank of mirrors 1002 is displaced downward from a neutral plane.

FIG. 10 schematically depicts an exposure pattern 1010 formed on a substrate when exposed to a strong phase shift optical pattern. The dark bands 1012 of intentionally unexposed surface area generated by the phase interference patterns of the mirror array are shown. This depiction also illustrates unintentionally underexposed areas 1011 of the substrate that are not completely exposed to light due to the effects of the edges of the pattern formed by mirror array 1000. In order to remove these under exposed areas 1011 a second "trim exposure" is often required. Such a trim exposure can be achieved by reconfiguring the mirror array as a binary type exposure pattern. Such a binary configuration can prevent ("block") the light from reaching, the desired portions of the dark bands 1012 (the ones that define the desired end-product). A second exposure is used to wash out the underexposed areas 1011 and the undesirable portions of the dark bands 1012. One significant advantage of some embodiments of the invention are that instead of removing the phase shift mask, attaching a new trim mask, and aligning the trim mask, as is required in the prior art, all that need be done is a reconfiguration of the mirror array. This is typically accomplished by implementing a software routine that reconfigures the programmable addressable mirror array to the desired configuration. Moreover, since the mirror array has not been moved it is already aligned.

FIG. 10C provides a schematic illustration of a mirror pattern (interposed on to the substrate surface) that can be used to generate an appropriate binary analog that will prevent the exposure of the dark lines 1012. One suitable mirror pattern is schematically depicted. One appropriate binary analog can be generated by configuring the mirror array to include checkerboard patterns 1015, 1016 of alternating tilt mirrors arranged such that the desired portions of the dark lines 1012 remain dark. The dark boxes L representing mirrors tilted, for example, to the left and the light boxes R tilted, for example, to the right. The rest of the mirrors can remain neutral. Such a configuration will prevent the exposure of the desired portions of the dark lines 1012 as shown in FIG. 10D.

In one other exposure embodiment, asymmetric pattern aberrations can be corrected. Also other phase imperfections can be corrected. By reversing the displacement of the mirrors these aberrations can be corrected. For example, all mirrors that were displaced above neutral are displaced below neutral and vice versa. Also, in tilt mirror implementations the tilts are simply reversed. Thus, in order to implement such a scheme, the mirror array is configured in a first configuration and the substrate is exposed at one half the normal dose. The mirror array is then reconfigured in a second opposite or complementary configuration (where all the mirror orientations are reversed) and the substrate is exposed to the other half of the dose. This process can also be referred to as asymmetric pattern correction.

FIG. 11 is a flow chart illustrating operations in performing direct write optical lithography using mirror arrays, in accordance with one embodiment of the present invention. The process commences in operation 1102 with the configuration of the array. The individual mirrors in the array are capable of configuration as either tilt mirrors or piston mirrors. By appropriately controlling the array and the stage, in a one-pass operation, the selected features of the pattern may be created using the configured mirrors of the array. In one implementation, the mirrors are configured through the implementation of software which individually (or in groups) configures the mirrors.

Next, in operation 1104, the sample (e.g., wafer) is illuminated using the configured array. In one embodiment a continuous scan is performed with the exposure for each configuration of the array occurring during a short interval of the entire interval that the wafer is aligned with the corresponding mirror array.

If the scan is not completed as determined in operation 1106, the process flow is directed to operation 1110 where the array is reconfigured for the next exposure, with the illumination occurring after reconfiguration. The process of reconfiguring the array (1110) and illuminating the array (1104) continues until a determination is made in operation 1106 that the scan is complete. Once the scan is completed, the process ends at operation 1112. Accordingly, during a typical raster scan the mirror array can be configured thousands of times, the precise amount of reconfigurations depending on the size of the wafer, the size of the wafer features, the size of the mirror array, and the number of passes. Multiple passes provide advantages in greater dose control and correction for image placement errors.

By combining the tilted mirrors and the fixed piston mirrors the contrast has been enhanced and accordingly the process window enlarged. Moreover, by combining tilting and piston type displacement for an individual mirror in the array, improved resolution results. Accordingly, the present invention, in accordance with one embodiment, replaces a standard reticle with a programmable mirror array system configured to control at least one of tilting and lateral position of the mirrors in order to control the light flux to the wafer. The direct-write mirror configuration as described provides increased resolution while maintaining compatibility with existing scanning platforms. Further, the system is easily adapted to new patterns or to design iterations for existing masks.

Some embodiments of the invention find particular utility in low volume patterning applications. That is, for production runs requiring relatively few chips, for example, prototype runs, maskless lithography helps reduce costs by eliminating the capital costs of the expensive reticles. The present invention provides an array of micromirrors that are reconfigurable or programmable and provides enhanced contrast. The maskless direct write system can be used or adapted to form any pattern without incurring the high capital outlays for numerous reticles.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a pattern on a substrate, the method comprising:
   providing a substrate having formed thereon a photosensitive layer;
   providing a mirror array comprising a plurality of mirrors capable of operating as at least one of piston mirrors or tilt mirrors;
   configuring the mirrors such that the arrangement of the mirrors of the mirror array comprises operating the mirrors as piston mirrors and arranging the plurality of mirrors such that the displacement of the mirrors from a neutral plane of the mirror array enables the mirror array to generate a resultant image pattern comprising a strong phase shift interference pattern wherein the plurality of piston mirrors are arranged in a graduated mirror displacement pattern such that the graduated mirror displacement pattern of the mirrors from a neutral plane of the mirror array generates less than the maximum interference in an illuminating light thereby shifting the resultant image pattern enabling a desired phase interference pattern to be created in light directed onto the mirror array and enabling gray scaling in a resultant image pattern thereby moving at least a portion of a feature on the photo sensitive layer;
   illuminating the mirror array with light to form the resultant image pattern having the desired phase interference pattern; and
   exposing the photosensitive layer of the substrate with the resultant image pattern.

2. The method of claim 1 wherein the displaced piston mirrors are maintained in a substantially parallel orientation to the mirrors in the neutral plane of the mirror array.

3. The method of claim 1 wherein configuring the mirrors to enable the creation of a desired phase interference pattern comprises arranging the plurality of mirrors such that the displacement of the mirrors from a neutral plane of the mirror array enables varying degrees of interference in the illuminating light thereby forming the resultant image pattern having the desired phase interference pattern, the amount of interference corresponding to the degree of displacement.

4. The method of claim 1 wherein exposing the photosensitive layer of the substrate with the resultant image pattern generates a feature on the photosensitive layer of the substrate.

5. The method of claim 1 wherein the substrate comprises a semiconductor substrate.

6. A method of forming a pattern on a substrate, the method comprising:
providing a substrate having formed thereon a photosensitive layer;
providing a mirror array comprising a plurality of mirrors capable of operating as at least one of piston mirrors or tilt mirrors;
configuring the mirrors in a first mirror arrangement such that the mirrors of the mirror array enable a first phase interference pattern to be created in light directed onto the mirror array, the first mirror arrangement comprises displacing a first mirror of the mirror array relative to a second adjacent mirror of the mirror array a distance sufficient to induce a phase difference of about 180 degrees in a light signal reflected byte mirrors;
illuminating the mirror array in the first mirror arrangement with light to form the first chase interference pattern;
exposing the photosensitive layer of the substrate with the first phase interference pattern;
configuring the mirrors in a second mirror arrangement such that the mirrors of the mirror array enable a second phase interference pattern to be created in light directed onto the mirror array by reversing the polarity of the displacement of the first mirror and second adjacent mirror to enable optical proximity correction;
illuminating the mirror array in the second mirror arrangement with light to form the second phase interference pattern; and
exposing the photosensitive layer of the substrate with the second phase interference pattern.

7. A method of forming a pattern on a substrate, the method comprising:
providing a substrate having formed thereon a photosensitive layer;
providing a mirror array comprising a plurality of mirrors capable of operating as at least one of piston mirrors or tilt mirrors;
configuring the mirrors in a first mirror arrangement such that the mirrors of the mirror array enable a first phase interference pattern to be created in light directed onto the mirror array, wherein configuring the mirrors in the first mirror arrangement comprises displacing a first mirror of the mirror array a first distance from a neutral plane of the mirror array and displacing a second mirror of the mirror array a second distance from a neutral plane of the mirror array such that the displacement of the first mirror relative to the second adjacent mirror is sufficient to induce a phase difference of about 180 degrees in a light signal reflected by the first and second mirrors;
illuminating the mirror array in the first mirror arrangement with light to form the first phase interference pattern;
exposing the photosensitive layer of the substrate with the first phase interference pattern;
configuring the mirrors in a second mirror arrangement such that the mirrors of the mirror array enable a second phase interference pattern to be created in light directed onto the mirror array, wherein configuring the mirrors in a second mirror arrangement comprises displacing the first mirror a third distance from the neutral plane wherein the third distance is of the same magnitude as the first distance but in an opposite direction from the neutral plane and wherein displacing the second mirror comprises displacing the second mirror a fourth distance from the neutral plane wherein the fourth distance is of the same magnitude as the second distance but in an opposite direction from the neutral plane such that the displacement of the first mirror relative to the second adjacent mirror is sufficient to induce a phase difference of about 180 degrees in a light signal reflected by the first and second mirrors;
illuminating the mirror array in the second mirror arrangement with light to form the second phase interference pattern; and
exposing the photosensitive layer of the substrate with the second phase interference pattern.

8. A method of forming a pattern on a semiconductor wafer, the method comprising:
modulating light directed to a portion of a photosensitive layer using a plurality of mirrors in a mirror array wherein the mirrors can be configured as piston mirrors, the plurality of piston mirrors configured such that the displacement of the mirrors form a neutral plane of the mirror array creates varying degrees of interference of light waves to form an exposure pattern on the photosensitive layer, the amount of interference corresponding to the degree of displacement of the mirrors, said modulating includes:
exposing the photosensitive layer to a first strong phase shift exposure pattern to form a first strong phase shift pattern in the photosensitive layer; and
exposing the photosensitive layer to a trim exposure pattern to complete the exposure pattern in photosensitive layer.

9. The method of claim 8 wherein exposing the photosensitive layer to the trim exposure pattern occurs before exposing the photosensitive layer to the first strong phase shift exposure pattern.

10. The method of forming a pattern on a semiconductor wafer as recited in claim 8, wherein exposing the photosensitive layer to a trim exposure pattern to complete the exposure pattern in photosensitive layer is achieved by operating at least a portion of the mirrors as tilt mirrors such that the mirrors are arranged in an alternating row pattern having a portion of one row tilted in a first direction and a portion of another row tilted in a second direction.

11. The method of forming a pattern on a semiconductor wafer as recited in claim 8, wherein exposing the photosensitive layer to a trim exposure pattern to complete the exposure pattern in photosensitive layer is achieved by operating at least a portion of the mirrors as tilt mirrors such that the mirrors are arranged in an alternating checkerboard configuration alternating tilt mirrors tilted in a first direction with tilt mirrors tilted in a second direction.

12. The method of forming a pattern on a semiconductor wafer as recited in claim 8, wherein exposing the photosensitive layer to a trim exposure pattern to complete the exposure pattern in photosensitive layer is achieved by arranging at least a portion of the plurality of mirrors to generate a binary exposure pattern on the photosensitive layer.

13. A method of forming a pattern on a semiconductor wafer, the method comprising:

modulating light directed to a portion of a photosensitive layer using a plurality of mirrors in a mirror array wherein the mirrors can be configured as piston mirrors, the plurality of piston mirrors configured such that the displacement of the mirrors from a neutral plane of the mirror array creates varying degrees of interference of light waves to form an exposure pattern on the photosensitive layer, the amount of interference corresponding to the degree of displacement of the mirrors;

wherein said modulating includes:

exposing the photosensitive layer to a first strong phase shift exposure pattern to form a first strong phase shift pattern in the photosensitive layer; exposing the photosensitive layer to a second strong phase shift exposure pattern to perform, an asymmetric pattern correction in the photosensitive layer; and exposing the photosensitive layer to a trim exposure pattern to complete the exposure pattern in photosensitive layer.

14. The method of claim 13 wherein modulating light directed to a portion of a photosensitive layer includes gray scaling portions of the exposure pattern to move features in the pattern.

15. The method of claim 14 wherein said gray scaling of the exposure pattern is achieved by arranging the plurality of piston mirrors such that the displacement of the mirrors from a neutral plane of the mirror array generates less than the maximum interference in the illuminating light thereby shifting the feature position in the pattern.

16. The method of claim 14 wherein said gray scaling of the exposure pattern is achieved by arranging the plurality of piston mirrors in a graduated mirror displacement pattern such that the graduated mirror displacement pattern of the mirrors from a neutral plane of the mirror may generates less than the maximum interference in the illuminating light thereby shifting the feature position in the pattern.

17. The method of claim 13 wherein the substrate comprises a semiconductor substrate.

18. The method of forming a pattern on a semiconductor wafer as recited in claim 13 wherein the mirrors are operated in a piston mirror arrangement configured to mimic the functioning of binary mask lithography.

19. The method of forming a pattern on a semiconductor wafer as in claim 13 wherein modulating light to form an exposure pattern on the photosensitive layer forms lines having a width of less than about 200 nm in width.

20. The method of forming a pattern on a semiconductor wafer as m claim 13 wherein modulating light to form an exposure pattern on the photosensitive layer forms lines having a width of less than about 150 nm in width.

21. The method of forming a pattern on a semiconductor wafer as in claim 20 wherein modulating light to form an exposure pattern on the photosensitive layer forms lines having a width in the range of about 60 nm (nanometers) in width to about 150 nm in width.

22. The method of forming a pattern on a semiconductor wafer as in claim 13 wherein modulating light to form an exposure pattern on the photosensitive layer can form a pattern of lines having a pitch of less than about 150 nm.

23. A method of forming a pattern on a substrate, the method comprising:

providing a substrate having formed thereon a photosensitive layer;

providing a mirror array comprising a plurality of mirrors capable of operating as at least one of piston mirrors or tilt mirrors;

configuring the mirrors in a first mirror arrangement enabling the formation of a first unbalanced phase interference pattern when the mirror arrangement is illuminated wherein the first mirror arrangement comprises having mirrors of the first mirror arrangement displaced in a first configuration sufficient to form first unbalanced phase interference pattern when illuminated;

illuminating the mirror array in the first mirror arrangement with light to form a first illumination signal having the first unbalanced phase interference pattern;

exposing the photosensitive layer of the substrate to the first unbalanced phase interference pattern;

configuring the mirrors in a second mirror arrangement such that the mirrors of the mirror array have an inverted displacement polarity configured to generate a second phase interference pattern wherein the configuring the mirrors in a second mirror arrangement enabling the formation of a second unbalanced phase interference pattern when the second mirror arrangement is illuminated, the second unbalanced phase interference pattern configured to alter a final pattern on the substrate to a desired final pattern wherein the second mirror arrangement is configured with an inverted mirror displacement polarity configured to generate a second unbalanced phase interference pattern which when taken with the first unbalanced phase interference pattern enables the formation of the desired final pattern on the substrate;

illuminating the mirror array in the second mirror arrangement with light to form the second unbalanced phase interference pattern; and exposing the photosensitive layer of the substrate with the second unbalanced phase interference pattern to form the desired final pattern on the substrate.

* * * * *